(12) United States Patent
Hsu et al.

(10) Patent No.: US 6,445,626 B1
(45) Date of Patent: Sep. 3, 2002

(54) COLUMN REDUNDANCY ARCHITECTURE SYSTEM FOR AN EMBEDDED DRAM

(75) Inventors: Louis L. Hsu, Fishkill; Rajiv V. Joshi, Yorktown Heights, both of NY (US); Gregory J. Fredeman, Essex Junction, VT (US)

(73) Assignee: IBM Corporation, Armonk, NY (US)

( * ) Notice: Subject to any disclaimer, the term of this patent is extended or adjusted under 35 U.S.C. 154(b) by 20 days.

(21) Appl. No.: 09/821,443

(22) Filed: Mar. 29, 2001

(51) Int. Cl.[7] ................................. G11C 7/00
(52) U.S. Cl. ............. 365/200; 365/189.07; 365/230.06
(58) Field of Search ........................... 365/200, 230.03, 365/230.06, 189.07, 189.08, 225.7

(56) References Cited

U.S. PATENT DOCUMENTS

| | | | | |
|---|---|---|---|---|
| 5,691,946 A | * | 11/1997 | DeBrosse et al. | 356/200 |
| 5,877,992 A | * | 3/1999 | Wu et al. | 365/200 |
| 5,973,976 A | * | 10/1999 | Sato | 365/222 |
| 6,144,591 A | * | 11/2000 | Vlasenko et al. | 365/200 |
| 6,400,619 B1 | * | 6/2002 | Hsu et al. | 365/189.07 |

* cited by examiner

*Primary Examiner*—Richard Elms
*Assistant Examiner*—Hien Nguyen
(74) *Attorney, Agent, or Firm*—Dilworth & Barrese, LLP

(57) ABSTRACT

A column redundancy architecture system for an embedded DRAM (eDRAM) having a wide data bandwidth and wide internal bus width is disclosed which provides column redundancy to defective datalines of the eDRAM. Internally generated column addresses of defective columns of each micro cell block are stored in a memory device during eDRAM array testing. Two redundancy reroute mechanisms are disclosed. The first redundancy reroute mechanism selects at least one defective dataline of the eDRAM and directly replaces the defective dataline(s) with at least one redundancy dataline. The second redundancy reroute mechanism discards the defective dataline column and replaces it with an adjacent dataline column. The dataline columns following the defective dataline column are then replaced with the next adjacent dataline columns including a redundancy dataline column.

26 Claims, 6 Drawing Sheets

COLUMN REDUNDANCY ARCHITECTURE SYSTEM FOR AN EMBEDDED DRAM

FIELD OF THE INVENTION

This invention relates to the field of integrated circuit (IC) design. Specifically, it relates to a column redundancy architecture system for an embedded DRAM (eDRAM) having a wide data bandwidth and wide internal bus width.

BACKGROUND OF THE INVENTION

Embedded DRAMs (eDRAMs) with wide data bandwidth and wide internal bus width have been proposed to be used as L2 (level-2) cache to replace pure SRAM cache. Since each DRAM memory cell is formed by a transistor and a capacitor, the size of DRAM cache is significantly smaller than that of SRAM cache. In order to meet performance requirements, DRAMs are made of a plurality of blocks or micro-cells. A block is a small DRAM array unit formed by a plurality of wordlines (e.g., from 64 to 256) and a plurality of bitline pairs (e.g., from 64 to 256). The size of a block is much smaller (e.g., 16X to 256X) than that of a bank of a conventional stand-alone DRAM. Only one block of the eDRAMs is activated each time. The read and write speed of an eDRAM can be fast due to very light loading of wordlines and bitlines.

In order to effectively utilize the large DRAM cache size, a small SRAM unit about the same size of an eDRAM block is used. The SRAM unit serves as a cache interface between an eDRAM and processor(s). The wide internal bus is used for transferring data among eDRAM, SRAM and the processor(s). More specifically, data residing in eDRAM memory cells coupled to a wordline traversing an eDRAM block is transferred to primary sense amplifiers. The data is then transferred to corresponding secondary sense amplifiers. The data is then transferred to the SRAM and stored in the memory cells thereof at the same wordline location. A TAG memory records the block address of the data stored within the SRAM. The data is then transferred to the processor(s).

Generally, neither column addressing nor column decoding is provided for the wide bandwidth eDRAM configuration, since they are not necessary. Hence, a main challenge of the wide bandwidth eDRAM configuration is to provide an effective column redundancy scheme to repair defective column elements without using column addressing. Most of the conventional DRAM approaches require a column address to indicate the location of failed column elements requiring repair.

In a conventional DRAM array, bitline pairs are grouped hierarchically by column address. Only one data bit from a group of bitlines is selected to be transferred via the local and global datalines each time. Therefore, the most common redundancy approach for the conventional DRAM is to provide repair for whole group of bitlines using the column address.

This approach does not lend itself to a wide bandwidth eDRAM, because data from every pair of bitlines of the eDRAM is simultaneously accessed. Further, since all the datalines are coupled to the eDRAM, the data from every pair of bitlines is simultaneously transferred to SRAM; and since all the datalines are coupled to the SRAM, the data from the SRAM is all simultaneously transferred to the processor(s). For such a one-to-one wiring configuration, if any of the datalines fail and no redundancy is offered, the chip must be discarded. If, however, redundancy bitlines are provided in the wide bandwidth eDRAM, it is not easy to correctly replace the failed pair of bitlines without affecting the integrity of the data. Additionally, it is difficult to locate the failed pair of bitlines in the wide bandwidth eDRAM, since, as noted above, column addressing is not available for the wide bandwidth eDRAM.

SUMMARY

An aspect of the present invention is to provide a column redundancy architecture system for an embedded DRAM (eDRAM) having a wide data bandwidth and wide internal bus width.

Another aspect of the present invention is to provide a column redundancy architecture system for an eDRAM having a self-diagnostic system for testing column redundancy elements of the architecture system.

Accordingly, a column redundancy eDRAM architecture system for an embedded DRAM having a wide data bandwidth and wide internal bus width is disclosed which provides column redundancy to defective datalines of the eDRAM. Internally generated column addresses of defective columns of each micro cell block are stored in a memory device during eDRAM array testing. Two redundancy reroute mechanisms are disclosed. The first redundancy reroute mechanism selects at least one defective dataline of the eDRAM and directly replaces the defective dataline(s) with at least one redundancy dataline. The second redundancy reroute mechanism discards the defective dataline column and replaces it with an adjacent dataline column. The dataline columns following the defective dataline column are then replaced with the next adjacent dataline columns including a redundancy dataline column.

Testing of the redundancy dataline column is done by first testing the non-redundancy dataline columns and then testing the redundancy dataline column. A logic high valid bit is stored within the memory device to indicate whether the redundancy of a particular micro cell block MCB of the eDRAM is being used or not. The valid bit allows the data to bypass the redundancy reroute mechanism being used, if the valid bit indicates that the redundancy is not being used.

DETAILED DESCRIPTION OF THE INVENTION

The present invention provides a column redundancy embedded DRAM (eDRAM) architecture system for an eDRAM having a wide data bandwidth and wide internal bus width. The column redundancy eDRAM architecture system has a self-diagnostic system for testing column redundancy elements of the architecture system.

Figure 1:
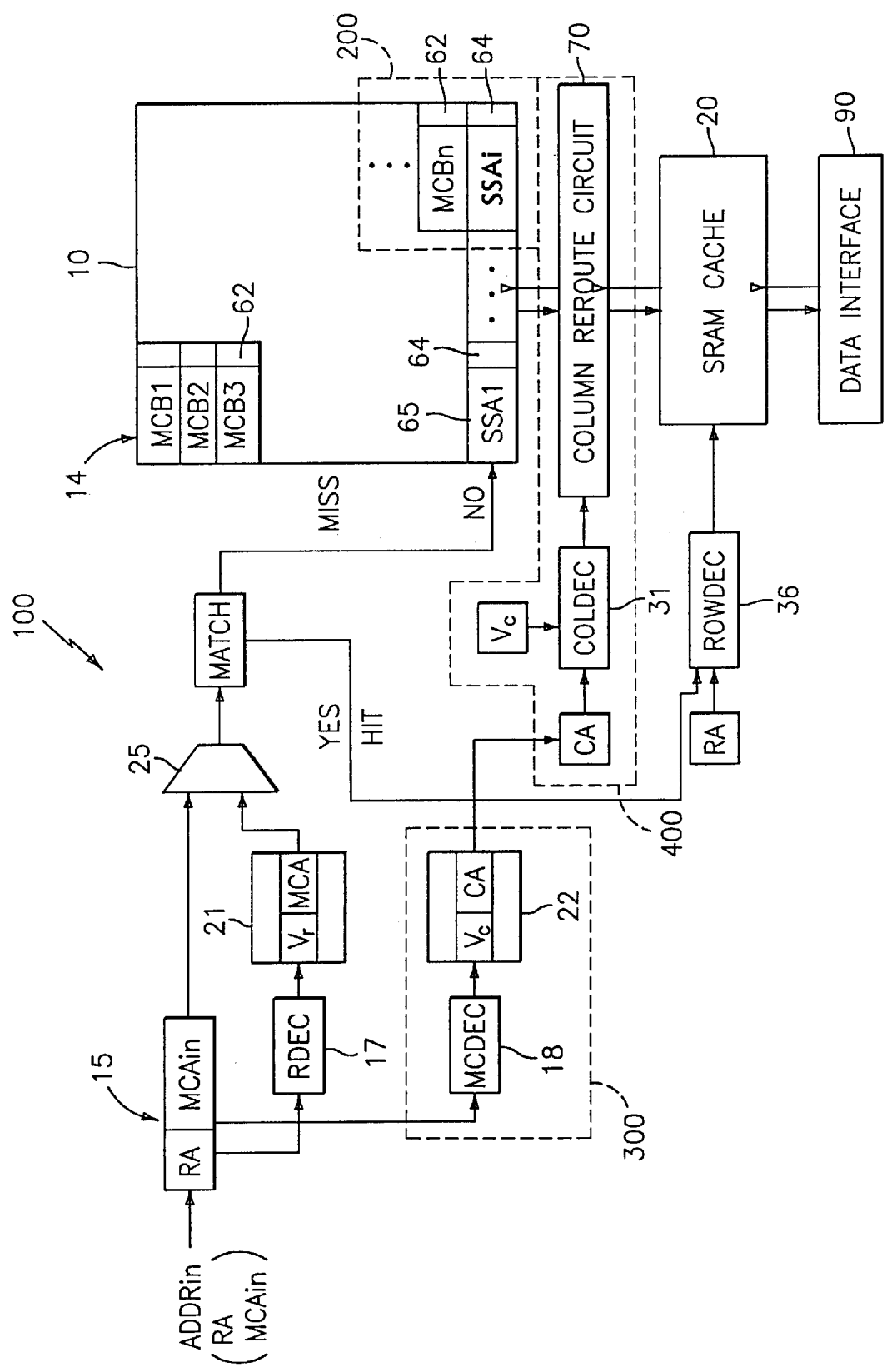
FIG. 1 is a block diagram of a column redundancy eDRAM architecture system according to the present invention.

With reference to FIG. 1, there is shown a block diagram of a column redundancy eDRAM architecture system for an eDRAM according to the present invention designated generally by reference numeral 100. The eDRAM is designated generally by reference numeral 10 and is configured for transferring data to an SRAM cache 20.

The eDRAM 10 includes a plurality of micro cell blocks, i.e., MCB1, MCB2, MCB3, . . . MCBn. Within each micro cell block, there is a designated bitline column redundancy block 62. Micro cell blocks are stacked in columns. Each column is referred to as a bank 14. Each bank 14 contains a secondary sense amplifier block (i.e., SSA1, . . . SSAi) 65. Each secondary sense amplifier block 65 has a plurality of secondary sense amplifiers 66 coupled to datalines of the eDRAM 10 (see FIG. 2). A redundancy group of datalines DL-R is coupled to a redundancy secondary sense amplifier block 64 adjacent (or within) each secondary sense amplifier block SSAi (see FIG. 2).

It is noted that only several components of the eDRAM 10 are shown by FIG. 1. One skilled in the art can appreciate that the eDRAM 10 includes other components, such as primary sense amplifier blocks having primary sense amplifiers, wordline decoders, driver circuits, etc., which are not shown by FIG. 1 for simplicity purposes.

For a read or write operation, an incoming address ADDRin containing a row address bit field RA and block address bit field, or micro cell block address bit field MCAin, is received by an address buffer register 15. The row address bit field RA is used to decode a TAG memory 21 via a row decoder (RDEC) 17. After the row is selected, the valid bit Vr which is stored within the TAG memory 21 and which corresponds to the selected row is checked.

If the valid bit Vr is high, i.e., Vr=1, the SRAM cache 20 of the selected row has been stored with a set of valid data. This valid data is from a block having its micro cell block address bit field MCA stored within the TAG memory 21. If the valid bit Vr is low, i.e., Vr=0, the SRAM cache 20 of the selected row has not been stored with a set of valid data.

If Vr is high, the micro cell block address bit field MCAin of the incoming address ADDRin is compared with the micro cell block address bit field MCA stored within the TAG memory 21 using a comparator circuit 25. If the two block addresses are identical, then a "hit" signal is issued which means data to satisfy a data read request is stored in the SRAM cache 20. If the two addresses do not match, or if the valid bit Vr is low, then a "miss" signal is issued which means data to satisfy the data read request is not stored in the SRAM cache 20.

Figure 3:
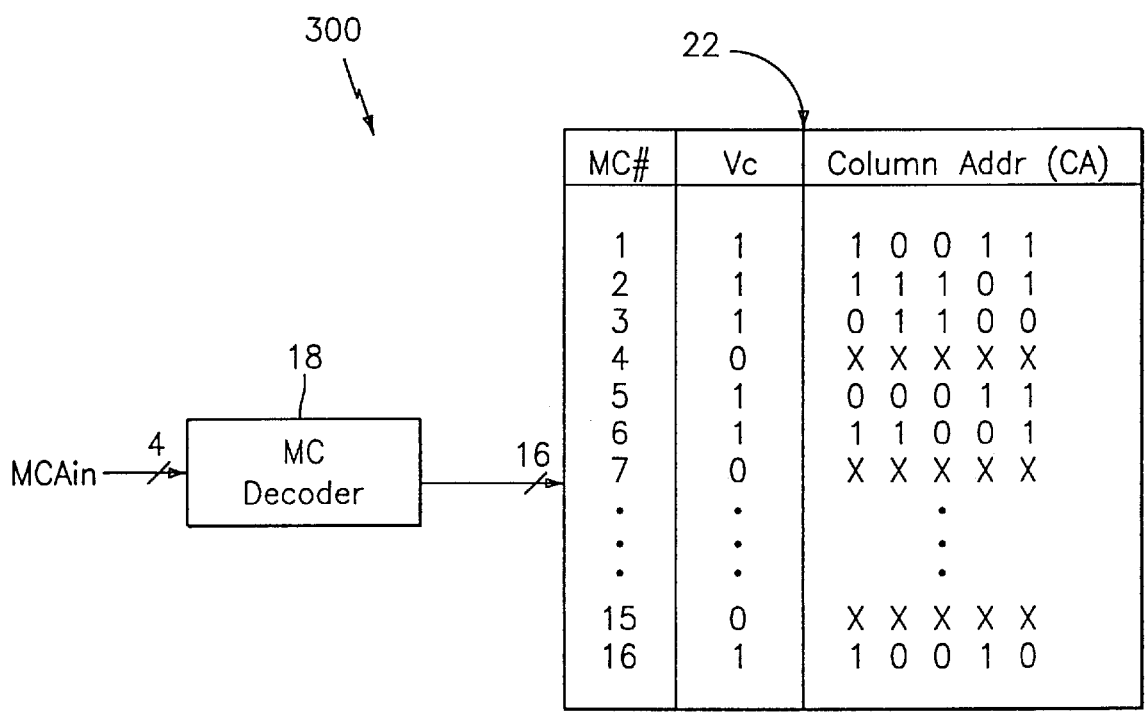
FIG. 3 is a block diagram of the components of another box identified in FIG. 1.

At the same time, the micro cell block address bit field MCAin of the incoming address ADDRin is provided to a micro cell decoder (MCDEC) 18. The micro cell decoder 18 uses the micro cell block address bit field MCAin for selecting an internally generated column address CA corresponding to the failed column stored within a fuse bank 22. The fuse bank 22, as further described below with reference to FIG. 3, is a fuse programmable array used to store fuse valid bits Vc and corresponding fuse column addresses CAs of each micro cell block MCB of the eDRAM 10. The data is stored within the fuse bank 22 during eDRAM array testing.

That is, during eDRAM array testing, if a group of adjacent bitlines inside each block of the eDRAM 10 is detected to be defective, the micro cell block's corresponding fuse column address CA is recorded in the fuse bank 22 together with its corresponding block location. At this moment, the fuse valid bit Vc is set to high, i.e., Vc=1, which means the redundancy of that block has been used. Otherwise, the fuse valid bit Vc is set to low, i.e., Vc=0, which means all the bitlines of that block have passed eDRAM array testing without failure. If more bitlines fail in any given block during eDRAM array testing and there is insufficient redundancy for repairing that block, the entire eDRAM macro is discarded.

The micro cell block decoder 18 uses the micro cell block address bit field MCAin of the incoming address ADDRin, if the micro cell block address bit field MCAin matches the micro cell address MCA stored within the TAG memory 21, to decode which micro cell block MCB of the eDRAM 10 is being accessed. If the fuse valid bit Vc stored within the fuse bank 22 and corresponding to that micro cell block location is high, then the corresponding stored fuse column address CA is used by a column decoder (COLDEC) 31 to decode which dataline column of the eDRAM 10 needs to be replaced with the group of redundancy datalines DL-R. The replacement is performed by a column reroute circuit block 70 as further described below with reference to FIG. 4A.

If the fuse valid bit Vc is low, then no redundancy has been used for that block, and data being transferred between the eDRAM 10 and SRAM cache 20 bypasses the column reroute circuit block 70. The low fuse valid bit Vc also disables the column decoder 31. Whether a read or write operation is intended, the specific row and block of the eDRAM 10 that the data should be read from or written to must be identified. The correct column location is located by using the specific internally generated column address CA stored within the fuse bank 22 and providing this column address CA to the column decoder 31. Specific details of a read and write operation are described below with reference to FIGS. 5 and 6.

Referring back to the comparison between the incoming micro cell block addresses MCAin and MCA from the TAG memory 21 by the comparator 25, if the two addresses match, then a "hit" signal is triggered. The hit signal is received by a row decoder (ROWDEC) 36 which causes the row decoder 36 to receive the row address bit field RA of the incoming address ADDRin. The row decoder 36 uses the row address bit field RA to decode a corresponding row of the SRAM cache 20. If the two addresses do not match, then a "miss" signal is triggered. The miss signal is received by a row decoder inside the eDRAM 10 which causes the row decoder to decode a correct wordline of a correct micro cell block MCB.

Figure 2:
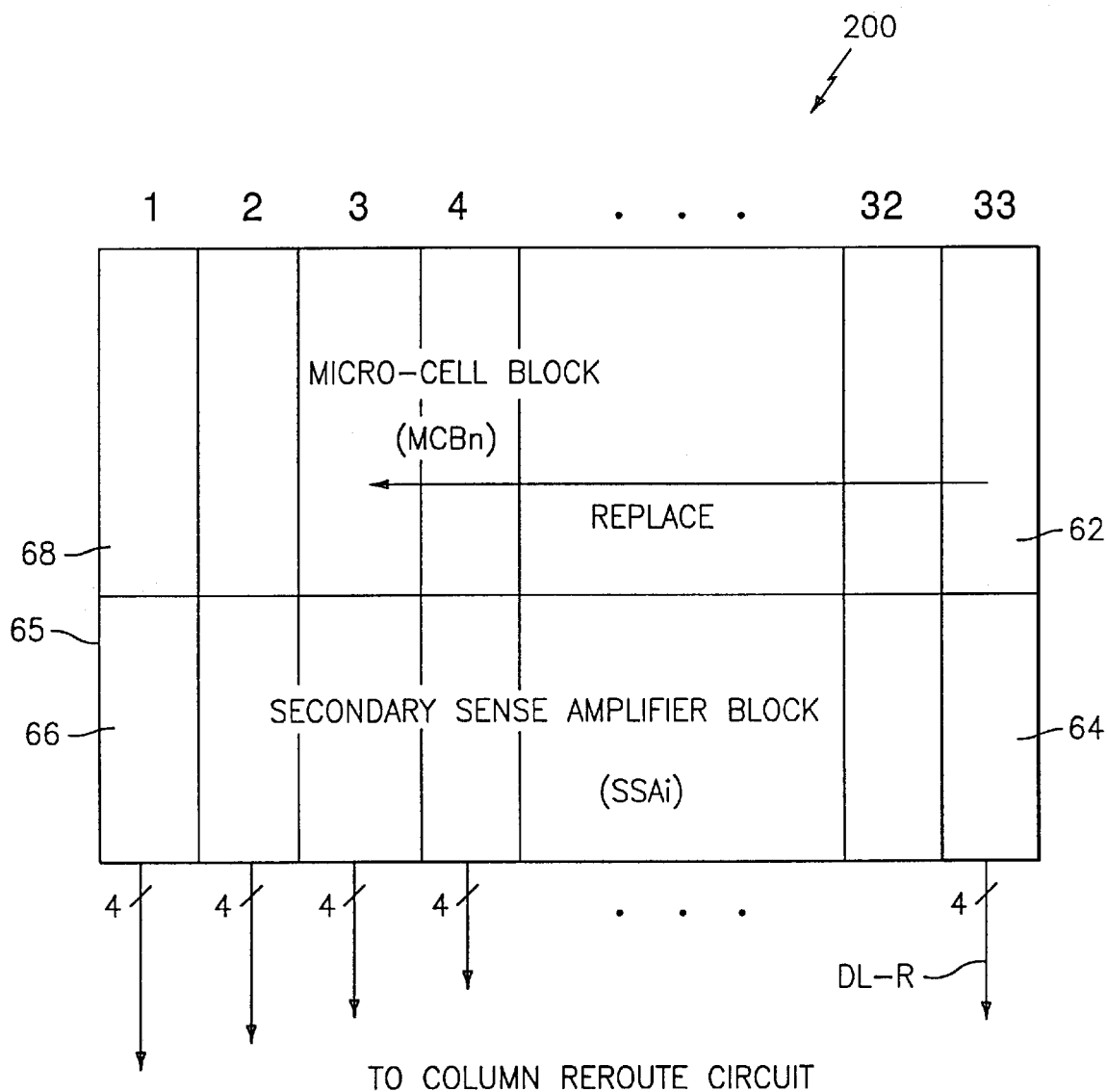
FIG. 2 is a schematic diagram of the components of a box identified in FIG. 1.

With reference to FIG. 2, there is shown a schematic diagram of the dotted box identified in FIG. 1 by reference numeral 200. The box 200 includes a micro cell block MCBn and a secondary sense amplifier block SSAi (also referenced by reference numeral 65). The bitline column redundancy block 62 is adjacent (or within) the micro cell block MCBn and the redundancy secondary sense amplifier block 64 is adjacent (or within) the secondary sense amplifier block SSAi. The secondary sense amplifier block 64 contains the same number of secondary sense amplifiers as any of the secondary sense amplifier blocks 66.

Each micro cell block MCB of the eDRAM 10, which includes micro cell block MCBn, for example has 32 groups of four-bitline pairs (or 128 bitlines). Each group is identified by reference numeral 68. A $33^{rd}$ group of four-bitline pairs is provided within the bitline column redundancy block 62. This group of four-bitline pairs is used to replace any faulty group of four-bitline pairs in the respective micro cell block MCB. For example, if group three of the micro cell block MCBn is damaged, or any or all four-bitline pairs are faulty, then group 33, or the four-bitline pairs of the bitline column redundancy block 62, is used to replace group three, as shown by the arrow identified by the word "REPLACE" in FIG. 2, in order for the eDRAM 10 to function normally.

The replacement of any of the four-bitline pairs with the four-bitline pairs of the bitline column redundancy block 62 is triggered by the column decoder 31 using a fuse column address CA. The column decoder 31 transmits a decoded signal via the column reroute circuit 70 to the appropriate bitline column redundancy region 62 of a micro cell block MCB which corresponds to the incoming micro cell block address MCAin to replace the failed bitlines of the micro cell block MCB. The replacement is dynamic and handled "on the fly". Since in each access cycle of the eDRAM 10, a different micro cell block MCB may be accessed, a different bitline column redundancy block 62 within the eDRAM 10 is signaled for undergoing the replacement procedure.

It is noted that according to the design shown by FIG. 2, if more than one group of four-bitline pairs fails, then the chip cannot be fixed. It is therefore contemplated to include more than one bitline column redundancy block 62 for each micro cell block MCB of the eDRAM 10, such that more than one group of four-bitline pairs for each micro cell block MCB can be replaced. However, since each micro cell block MCB is relatively small, the probability of more than one group of four-bitline pairs failing within each micro cell block MCB is extremely low. Therefore, the number of redundancy blocks 62 provided for each micro cell block MCB depends on the size of the micro cell block MCB.

Each secondary sense amplifier block 65 of the eDRAM 10, which includes secondary sense amplifier block SSAi, preferably has 33 corresponding secondary sense amplifiers 66. Each secondary sense amplifier 66 provides sensing capability for four-bitline pairs of the corresponding group of four-bitline pairs. Four datalines from each secondary sense amplifier 66 are coupled to the column reroute circuit block 70. Therefore, 132 datalines, which includes the four redundancy datalines DL-R of the redundancy secondary sense amplifier block 64 are coupled to the column reroute circuit block 70. The four redundancy datalines DL-R can be shared by a plurality of banks 14 located in the same column of the eDRAM 10 as shown in FIG. 1.

FIG. 3 illustrates a block diagram of the components of a dotted box identified in FIG. 1 by reference numeral 300. The box 300 includes the micro cell block decoder 18 and the fuse bank 22. The fuse bank 22 is formed by a fuse array storing information regarding column redundancy replacement. After eDRAM array testing, the column addresses CAs of the faulty micro cell blocks MCBs of the eDRAM 10 are recorded in the fuse bank 22 in micro cell block location order. Fuse registers which are used to store fuse information can be an SRAM, a flash memory, or a ROM array.

For example, in the block diagram shown by FIG. 3, micro cell block 1 which has failed has a fuse column address CA of 10011. The corresponding fuse valid bit Vc for micro cell block 1 is set to high; this indicates that the redundancy bitlines of the bitline column redundancy block 62 corresponding to micro cell block I have been used for micro cell block 1. The corresponding fuse valid bit Vc for micro cell blocks 4, 7 and 15 is set to low; this indicates that these micro cell blocks do not need repair and their corresponding redundancy bitlines have not been used.

Accordingly, for these blocks, no fuse column address CA is recorded in the fuse bank 22. The micro cell block address bit fields MCAin of the incoming address ADDRin are used to decode and select the micro cell blocks. Once a micro cell block is selected, the internally generated column address or fuse column address CA is used to guide the column reroute activity.

It is contemplated that a nonvolatile memory array can be used instead of the fuse bank 22. For example, a small flash memory array can be used to store the information of the fuse valid bit Vc and fuse column address CA for each micro cell block MCB within a column address table. The data stored in the flash memory array is not erased when the power to the array is turned off. Hence, the advantage of using this kind of memory over the fuse bank 22 is that programming of the eDRAM 10 can be performed even when the chip is in a package module. During a power-on test, if the BIST (built-in-self-test) discovers any defects, the column address table stored within the flash memory array can be updated, thus making redundancy programming more flexible.

Figure 4A:
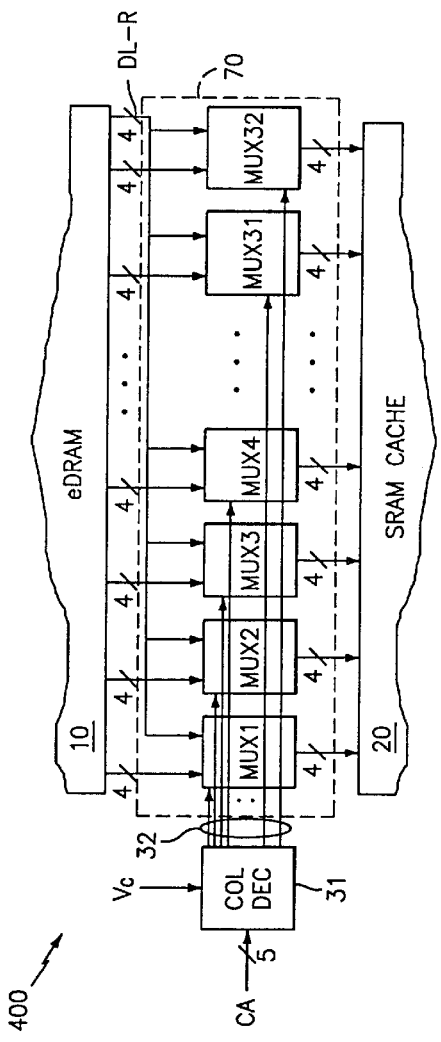
FIG. 4A is a block diagram of the components of a column reroute mechanism.

FIG. 4A illustrates a block diagram of the components of a column reroute mechanism identified by dotted box 400 in FIG. 1. The box 400 includes the column decoder 31 and the column reroute circuit block 70. The datalines from the eDRAM 10, including the redundancy group of datalines DL-R, are fed to corresponding multiplexers MUX1–MUX32. If any group of datalines is defective, the redundancy group of datalines DL-R which are fed to each one of the multiplexers MUX1–MUX32, are used to replace the defective group of datalines.

For example, MUX1 selects either the first four datalines, i.e., first group of datalines, or four redundancy datalines, i.e., the redundancy group of datalines DL-R, based on the output of the column decoder 31. The internally generated column address CA obtained from the fuse bank 22 is used by the column decoder 31 to decode and direct dataline swapping or replacement. For example, if one or more datalines in the second group of datalines are defective, the fuse column address CA indicates to the column decoder 31 that the second group of datalines is defective. Accordingly, the column decoder 31 transmits a logic high signal to the second multiplexer MUX2 to switch the second group of datalines with the redundancy group of datalines DL-R. Only one logic high signal can be transmitted at any one time using the column redundancy architecture of the present invention.

In other words, only one of the 32 groups of datalines will be replaced with the redundancy group of datalines DL-R, if the fuse valid bit Vc is set to high. Or, otherwise, if the fuse valid bit Vc is set to low, then no replacement of datalines takes place. The fuse valid bit Vc, if set to low, also disables the column decoder 31 to prevent dataline swapping, since it is not needed.

Figure 4B:
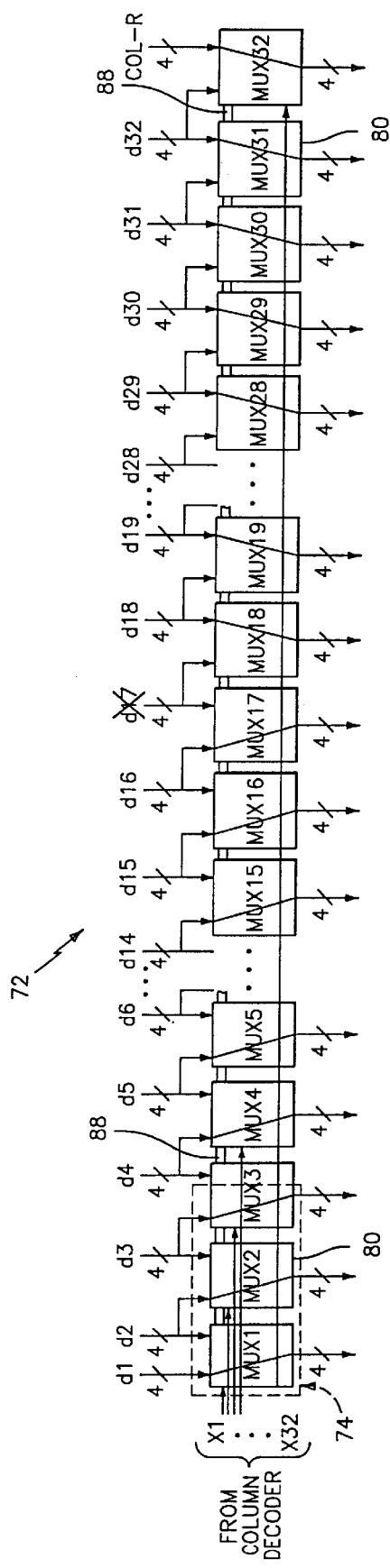
FIG. 4B is schematic diagram of an alternative column reroute mechanism.

With reference to FIG. 4B, there is shown a schematic diagram of an alternative column reroute mechanism according to the present invention. This column reroute mechanism includes a reroute circuit 72 which allows adjacent group of datalines to be swapped. In a preferred embodiment of reroute circuit 72, 32 multiplexers MUX1–MUX32 are used. Each multiplexer selects either the left or right group of datalines to pass through.

For example, if the column decoder 31 indicates that the $17^{th}$ group of datalines dl7 is defective, as indicated by the "X" over the $17^{th}$ group, then the first through the $16^{th}$ group of datalines d1-d16 pass through the first 17 multiplexers MUX1–MUX17, respectively. The 18$^{th}$ to the 32$^{nd}$ group of datalines d18-d32 pass through the next 14 multiplexers MUX18–MUX31. The redundancy group of datalines, which is identified by col-r in FIG. 4B, is allowed to pass to the SRAM cache 20 through the last multiplexer MUX32. The datalines of the 17$^{th}$ group d17 are skipped without transferring any data to the SRAM cache 20. Therefore, the defective dataline column, i.e., the 17$^{th}$ group of datalines d17, is replaced with the adjacent dataline column, i.e., the 18$^{th}$ group of datalines d18, and the following dataline columns are replaced with the next adjacent dataline columns, including the redundancy dataline column, i.e., the redundancy group of datalines col-r. Hence, the 32$^{nd}$ group of datalines d32 is replaced with the redundancy group of datalines col-r.

Figure 4C:
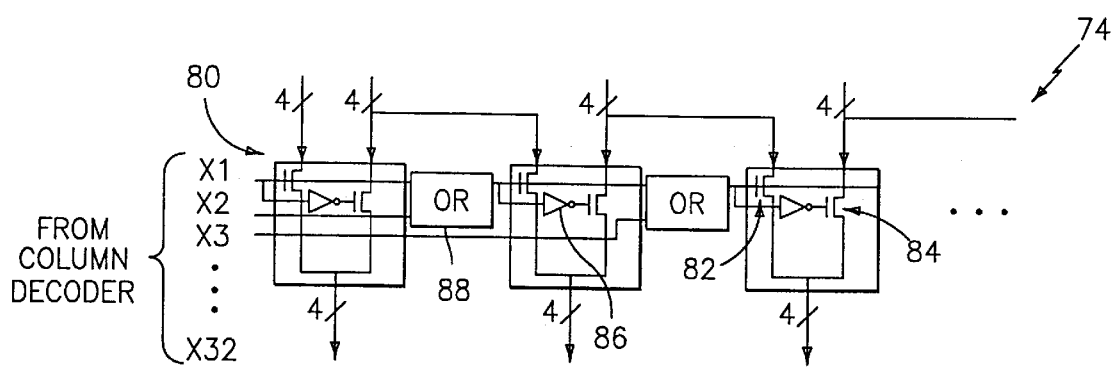
FIG. 4C is a schematic diagram of a circuit for executing the column reroute mechanism shown by FIG. 4B.

FIG. 4C is a schematic diagram illustrating an exemplary circuit 74 for executing the column reroute mechanism shown by FIG. 4B. The circuit 74 includes 32 stages 80, where each stage 80 is one of the 32 multiplexers MUX1–MUX32 (only the first three stages 80 are shown by FIG. 4C as indicated by the dotted box in FIG. 4B). Each stage 80 (or multiplexer) includes an input for receiving one of the 32 decoded signals x1–x32, two switches 82, 84, an inverter 86 and an OR-gate 88. The swapping operation is activated by the decoded signal received from the column decoder 31. The OR gates 88 are used to propagate the swapping operation for the rest of the multiplexers. For example, if MUX18 is switched to take the signal from the right hand side, as shown by FIG. 4B, then the rest of the MUXs to the right of MUX18 are switched to take the respective signal from the right hand side by the OR gates 88 of the stages 80 following MUX18.

Figure 5:
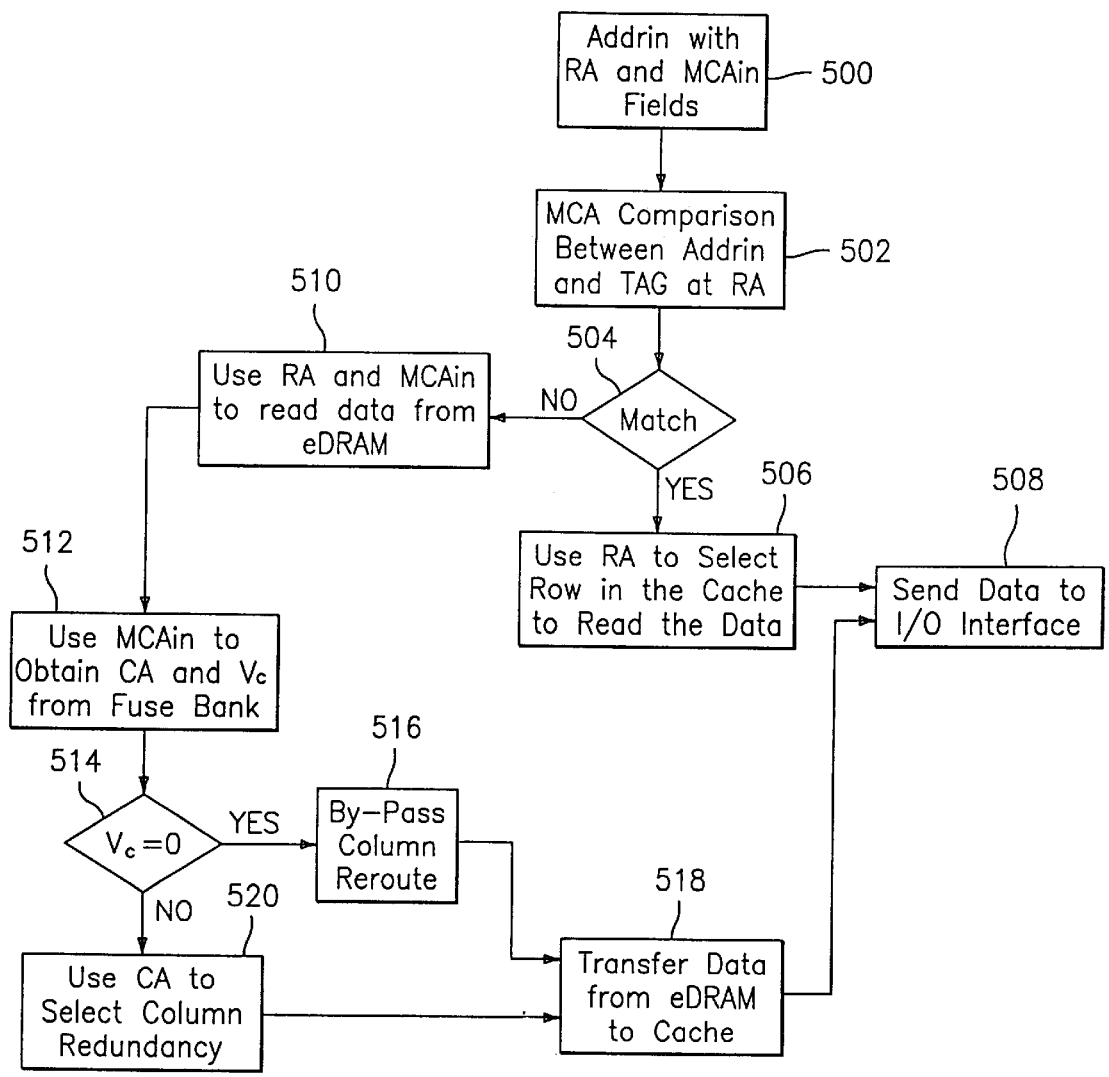
FIG. 5 is a flow chart of a read operation utilizing the column redundancy eDRAM architecture system according to the present invention.

With reference to FIG. 5, there is shown a flow chart of a read operation utilizing the column redundancy eDRAM architecture system of the present invention. For each read operation, the incoming address ADDRin is provided by a processor containing both the row address bit field RA and the micro cell block address bit field MCAin (Step 500). The row address bit field RA is used to find the micro cell block address bit field MCA of the data that is stored in the SRAM cache 20 using the TAG memory 21.

The micro cell block address bit field MCAin of the incoming address ADDRin and the micro cell block address bit field MCA stored in the TAG memory 21 are then compared (Step 502). A check is then made to determine if the two addresses are identical, i.e., if they match (Step 504). If the two addresses are identical, i.e., a "hit" signal is triggered, then the row address bit field RA is provided to a row decoder 36 to decode the SRAM cache 20 (Step 506) and transfer the data stored within a row of the SRAM cache 20 corresponding to the row address bit field to the I/O data interface 90 (see FIG. 1) (Step 508).

If the two addresses are not identical, i.e., a "miss" signal is triggered, then the data is not in the SRAM cache 20, and it must be read from the eDRAM 10. The row address bit field RA and the micro cell block address bit field MCAin are used to decode the eDRAM 10 to get to the row of the micro cell block MCB where the correct data resides to read the data (Step 510). Simultaneously with Step 510 or afterwards, the micro cell block address bit field MCAin is used to find the fuse column address CA and fuse valid bit Vc information stored in the fuse bank 22 (Step 512).

The setting of the fuse valid bit Vc is then checked (Step 514). If the fuse valid bit Vc is set to low, i.e., Vc=0, then the data from the eDRAM 10 is transferred to the SRAM cache 20 directly, i.e., without using the column reroute circuit block 70 or reroute circuit 72 (Steps 516 and 518). The data is subsequently transferred from the SRAM cache 20 to the I/O data interface 90 (Step 508).

If the fuse valid bit Vc is set to high, i.e., Vc=1, then the fuse column address CA is used to steer column redundancy to replace at least one defected dataline (Step 520) before transferring the data to the SRAM cache 20 from the eDRAM 10 (Step 518). The data is subsequently transferred from the SRAM cache 20 to the I/O data interface 90 (Step 508).

Figure 6:
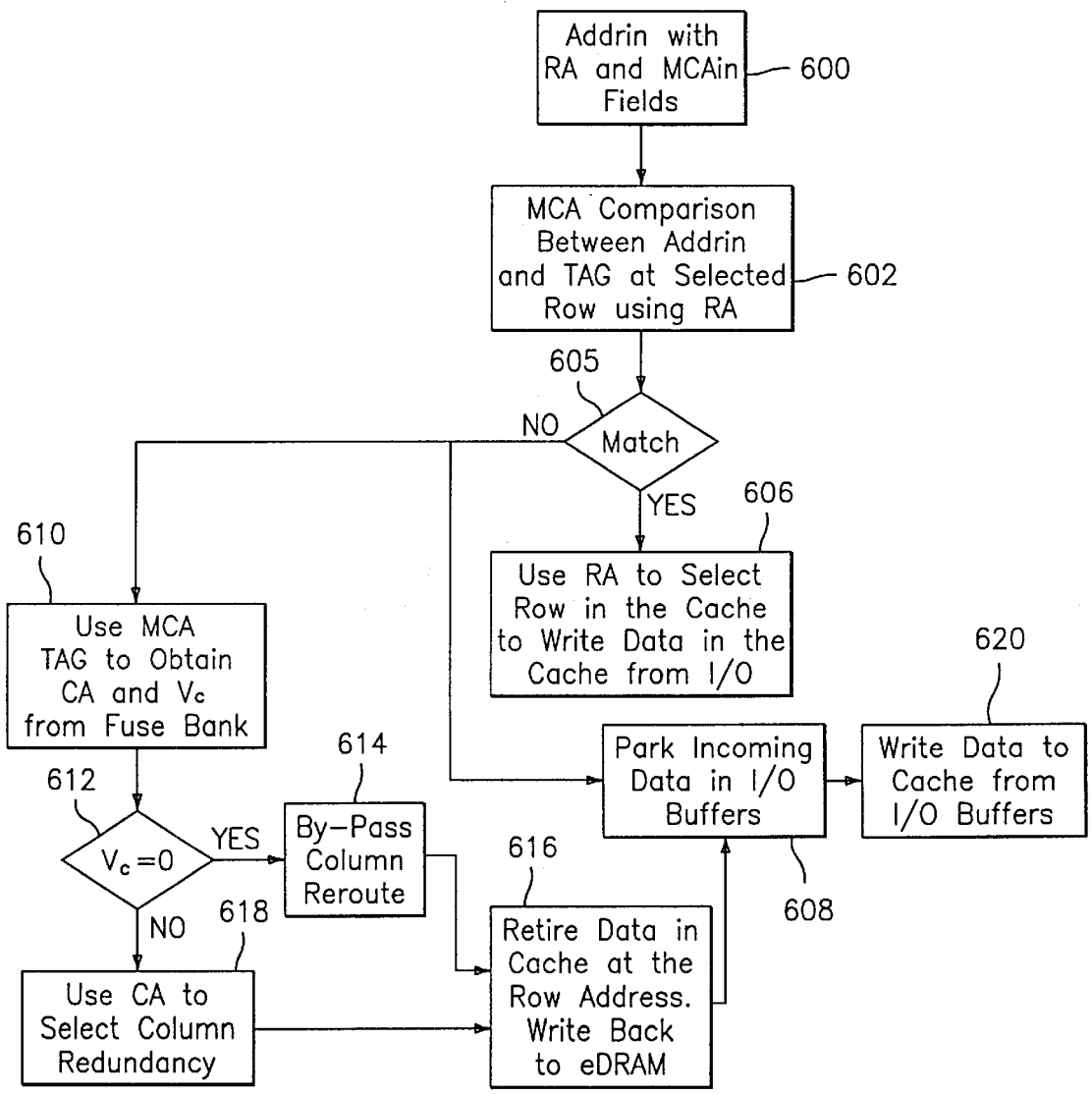
FIG. 6 is a flow chart of a write operation utilizing the column redundancy eDRAM architecture system according to the present invention.

With reference to FIG. 6, there is shown a flow chart of a write operation utilizing the column redundancy eDRAM architecture system of the present invention. For each write operation, both the incoming address ADDRin and the corresponding incoming data are received from the processor (Step 600).

The micro cell block address bit field MCAin of the incoming address ADDRin and the micro cell block address bit field MCA stored in the TAG memory 21 are then compared (Step 602). A check is then made to determine if the two addresses are identical, i.e., if they match (Step 604). If the two addresses are identical, i.e., a "hit" signal is triggered, then data received via the I/O data interface 90 is written to a row within the SRAM cache 20 corresponding to the row address bit field RA of the incoming address ADDRin (Step 606). If the two addresses are not identical, i.e., a "miss" signal is triggered, then incoming data is parked or stored in buffer registers of the I/O data interface 90 (Step 608). The micro cell block address bit field MCA is used to obtain the fuse column address CA and fuse valid bit Vc information from the fuse bank 22 (Step 610).

The setting of the fuse valid bit Vc is then checked (Step 612). If the fuse valid bit Vc is set to low, i.e., Vc=0, then column redundancy is not used for that particular micro cell block MCB. Hence, the old data stored within the SRAM cache 20 at the particular location identified by the row address bit field RA is transferred to the eDRAM 10 without passing through the column reroute circuit block 70 or reroute circuit 72 (Steps 614 and 616).

If the fuse valid bit Vc is set to high, i.e., Vc=1, then before proceeding to Step 616 to write the old data to the eDRAM 10, the fuse column address CA is used to select column redundancy to replace at least one defected dataline (Step 618). At Step 616, the old data stored within the row of the SRAM cache corresponding to the row address bit field is transferred to the eDRAM (to be written therein) via the plurality of datalines and at least one redundancy dataline. After the old data in the SRAM cache 20 is "retired", or restored to the eDRAM 10, the new data, including data parked or stored in buffer registers of the I/O data interface 90, is transferred (or written) to the SRAM cache 20 from the I/O data interface 90 (Step 620).

In conclusion, the column redundancy architecture system for an embedded DRAM having a wide data bandwidth and wide internal bus width provides column redundancy to defective datalines of the eDRAM 10. Internally generated column addresses CAs of defective columns of each micro cell block MCB are stored in the fuse bank 22, or other memory device, during eDRAM array testing. Two redundancy reroute mechanisms are presented. The first redundancy reroute mechanism shown by FIG. 4A selects at least one defective dataline of the eDRAM 10 and directly replaces the defective dataline(s) with at least one redundancy dataline. The second redundancy reroute mechanism shown by FIGS. 4B and 4C discards the defective dataline column and replaces it with the adjacent dataline column.

The dataline columns following the defective dataline column are then replaced with the next adjacent dataline columns including the redundancy dataline column.

Testing of the redundancy dataline column is done by first testing the non-redundancy dataline columns and then testing the redundancy dataline column. A logic high fuse valid bit Vc is stored within the fuse bank 22 to indicate whether the redundancy of a particular micro cell block MCB is being used or not. The fuse valid bit Vc allows the data to bypass the redundancy reroute mechanism being used, if the fuse valid bit Vc indicates that the redundancy is not being used.

What has been described herein is merely illustrative of the application of the principles of the present invention. For example, the systems described above and implemented as the best mode for operating the present invention are for illustration purposes only. As a particular example, for instance, other design configurations may be used for the column redundancy eDRAM architecture system which provide similar operation as the system described above. In other words, other arrangements and methods may be implemented by those skilled in the art without departing from the scope and spirit of this invention.

We claim:

1. A column redundancy architecture system for an embedded DRAM (eDRAM) system comprising:
    an eDRAM array comprising:
        a plurality of memory cell blocks having a plurality of bitlines traversing there through;
        a plurality of sense amplifiers each coupled to corresponding bitlines of the plurality of bitlines; and
        a plurality of datalines, including a group of redundancy datalines, coupled to corresponding sense amplifiers of the plurality of sense amplifiers, and
    a column reroute circuit coupled to the plurality of datalines and configured for receiving at least one signal for replacing at least one defective dataline of the plurality of datalines with at least one redundancy dataline of the group of redundancy datalines for passing data through the column reroute circuit.

2. The system according to claim 1, wherein each of said plurality of memory cell blocks includes a bitline redundancy block having at least one redundancy bitline for replacing at least one defective bitline of the plurality of bitlines.

3. The system according to claim 1, further comprising an SRAM cache coupled to the column reroute circuit for receiving data from the column reroute circuit transferred thereto by the plurality of datalines.

4. The system according to claim 1, further comprising a memory device for storing column addresses corresponding to memory cell blocks of the plurality of memory cell blocks having at least one defective bitline traversing there through.

5. The system according to claim 4, wherein the memory device further stores a fuse valid bit corresponding to each of the plurality of memory blocks, the fuse valid bit indicating whether at least one redundancy bitline is used to replace one of the plurality of bitlines traversing through a corresponding memory block.

6. The system according to claim 1, further comprising a micro cell block decoder for receiving a micro cell block address bit field of an incoming address and decoding a memory device for identifying a fuse column address bit field of a corresponding micro cell block.

7. The system according to claim 1, further comprising a row decoder for receiving a row address bit field of an incoming address, the row decoder decoding a memory for identifying a micro cell block address bit field of a micro cell block corresponding to the row address bit field.

8. The system according to claim 7, further comprising a comparator circuit for comparing a micro cell block address bit field of the incoming address with the micro cell block address bit field, and providing a first signal if the two address bit fields are identical and a second signal if the two address bit fields are not identical.

9. The system according to claim 8, wherein the first signal indicates data satisfying a data read request is stored in an SRAM cache and the second signal indicates data satisfying the data read request is not stored in the SRAM cache.

10. The system according to claim 8, wherein an SRAM row decoder receives the row address bit field and the first signal to decode an SRAM cache for identifying a row of the SRAM cache storing data satisfying a data read request.

11. The system according to claim 8, wherein an SRAM row decoder receives the row address bit field and the first signal to decode an SRAM cache for identifying a row of the SRAM cache for writing data thereto.

12. The system according to claim 1, further comprising an I/O data interface for transferring data from and to an SRAM cache.

13. The system according to claim 1, wherein the column reroute circuit includes a plurality of multiplexers, each of the plurality of multiplexers configured for receiving data passing through a respective group of datalines of the plurality of datalines and the at least one signal.

14. The system according to claim 13, wherein at least one dataline of the respective group of datalines corresponding to a particular multiplexer of the plurality of multiplexers is replaced with at least one other dataline of the plurality of datalines if the at least one signal received by the particular multiplexer is a logic high signal.

15. The system according to claim 14, wherein the at least one other dataline is a dataline belonging to the group of redundancy datalines.

16. The system according to claim 14, wherein the at least one other dataline is at least one dataline belonging to a group of datalines of the plurality of datalines which is adjacent to the at least one dataline.

17. The system according to claim 13, wherein each multiplexer includes two switches, an inverter and an OR gate.

18. A bitline column redundancy architecture system for an embedded DRAM (eDRAM) system comprising:
    an eDRAM array comprising:
        a plurality of memory cell blocks having a plurality of bitlines traversing there through, each of said plurality of memory cell blocks includes a bitline redundancy block having at least one redundancy bitline for replacing at least one defective bitline of the plurality of bitlines;
        a plurality of sense amplifiers each coupled to corresponding bitlines of the plurality of bitlines; and
        a plurality of datalines, including a group of redundancy datalines, coupled to corresponding sense amplifiers of the plurality of sense amplifiers; and
    a memory device for storing column addresses corresponding to memory cell blocks of the plurality of memory cell blocks having at least one defective bitline traversing there through.

19. The system according to claim 18, further comprising a column reroute circuit coupled to the plurality of datalines and configured for receiving at least one signal for replacing at least one defective dataline of the plurality of datalines with at least one redundancy dataline of the group of redundancy datalines for passing data through the column reroute circuit.

20. The system according to claim 19, further comprising an SRAM cache coupled to the column reroute circuit for receiving data from the column reroute circuit transferred thereto by the plurality of datalines.

21. The system according to claim 18, wherein the memory device further stores a fuse valid bit corresponding to each of the plurality of memory blocks, the fuse valid bit indicating whether at least one redundancy bitline is used to replace one of the plurality of bitlines traversing through a corresponding memory block.

22. A method for reading data to an I/O data interface of an eDRAM architecture system having an eDRAM and a plurality of memory cell blocks, the method comprising the steps of:

receiving an incoming address having a micro cell block address bit field and a row address bit field;

comparing the micro cell block address bit field with a micro cell block address bit field corresponding to the row address bit field and stored in a first memory;

if the two micro cell block address bit fields are identical, then:
using the row address bit field to select a corresponding row in an SRAM cache; and
transferring data stored in the selected row to the I/O data interface; and if the two micro cell block address bit fields are not identical, then:
using the micro cell block address bit field of the incoming address to obtain a fuse column address and a corresponding fuse valid bit from a second memory;
determining a logic state of the fuse valid bit;
transferring data from a micro cell block of the plurality of micro cell blocks corresponding to the obtained column address to the SRAM cache and transferring data from the SRAM cache to the I/O interface, if the logic state of the fuse valid bit is low; and
using the obtained column address for selecting and replacing at least one non-redundancy dataline of a plurality of datalines of the eDRAM architecture system with at least one redundancy dataline, transferring data from the eDRAM via non-replaced datalines of the plurality of datalines and the at least one redundancy dataline to the SRAM cache, and transferring data from the SRAM cache to the I/O interface, if the logic state of the fuse valid bit is high.

23. The method according to claim 22, further comprising the step of performing an eDRAM array test where at least one fuse column address corresponding to at least one defective memory cell block of the plurality of memory cell blocks is recorded, and at least one fuse valid bit corresponding to the defective memory cell block is set to a high logic state and at least one fuse valid bit corresponding to a non-defective memory cell block is set to a low logic state, wherein said step is performed prior to the step of receiving an incoming address having a micro cell block address bit field and a row address bit field.

24. A method for writing new data to an SRAM cache of an eDRAM architecture system having an eDRAM and a plurality of memory cell blocks, the method comprising the steps of:

receiving an incoming address having a micro cell block address bit field and a row address bit field;

comparing the micro cell block address bit field with a micro cell block address bit field corresponding to the row address bit field and stored in a first memory;

if the two micro cell block address bit fields are identical, then:
using the row address bit field to select a corresponding row in an SRAM cache; and
transferring new data from an I/O data interface to the selected row of the SRAM cache; and if the two micro cell block address bit fields are not identical, then:
using the micro cell block address bit field corresponding to the row address bit field to obtain a fuse column address and a corresponding fuse valid bit from a second memory;
determining a logic state of the fuse valid bit;
transferring old data stored within a row of the SRAM cache corresponding to the row address bit field to the eDRAM and transferring new data to the SRAM cache from the I/O data interface, if the logic state of the fuse valid bit is low; and
using the obtained fuse column address for selecting and replacing at least one non-redundancy dataline of a plurality of datalines of the eDRAM architecture system with at least one redundancy dataline, transferring old data stored within the row of the SRAM cache corresponding to the row address bit field to the eDRAM via non-replaced datalines of the plurality of datalines and the at least one redundancy dataline, and transferring new data to the SRAM cache from the I/O interface, if the logic state of the fuse valid bit is high.

25. The method according to claim 24, further comprising the steps of:

storing incoming data received by the eDRAM architecture system within the I/O data interface, if the two micro cell block address bit fields are not identical; and transferring the stored incoming data to the SRAM cache after old data stored within the row of the SRAM cache corresponding to the row address bit field is transferred to the eDRAM.

26. The method according to claim 24, further comprising the step of performing an eDRAM array test where at least one fuse column address corresponding to at least one defective memory cell block of the plurality of memory cell blocks is recorded, and at least one fuse valid bit corresponding to the defective memory cell block is set to a high logic state and at least one fuse valid bit corresponding to a non-defective memory cell block is set to a low logic state, wherein said step is performed prior to the step of receiving an incoming address having a micro cell block address bit field and a row address bit field.

* * * * *